(12) United States Patent
Helms et al.

(10) Patent No.: US 6,448,858 B1
(45) Date of Patent: Sep. 10, 2002

(54) MASK LAYOUT FOR SIDEFED RF POWER AMPLIFIER

(75) Inventors: David R. Helms, Tingsboro; Philip Antognetti, Chelmsford, both of MA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/662,465

(22) Filed: Sep. 15, 2000

(51) Int. Cl.[7] ................................................. H03F 3/68
(52) U.S. Cl. ........................ 330/295; 330/66; 257/203; 257/275; 257/207
(58) Field of Search ............................... 330/65, 66, 67, 330/68, 295; 257/203, 275, 207

(56) References Cited

U.S. PATENT DOCUMENTS

| | | | |
|---|---|---|---|
| 4,866,492 A | 9/1989 | Quigg | 357/23.4 |
| 4,877,749 A | 10/1989 | Quigg | 437/41 |
| 5,608,353 A | 3/1997 | Pratt | 330/295 |
| 5,629,648 A | 5/1997 | Pratt | 330/289 |
| 5,689,212 A | * 11/1997 | Floriot et al. | 330/295 |

* cited by examiner

Primary Examiner—Michael B Shingleton
(74) Attorney, Agent, or Firm—Connolly Bove Lodge & Hutz LLP

(57) ABSTRACT

A side fed RF amplifier comprising a plurality of transistors connected in parallel such that the base, emitter, and collector leads of each transistor are electrically connected to the base, emitter, and collector leads, respectively, of all other transistors. A common, physical point interconnects the power amplifier current source and the base leads of every transistor. The transistors are arranged such that the impedance between the common physical point and the base lead of any one transistor is substantially equivalent to the impedance between the common point and the base lead of any other transistor within the power amplifier.

11 Claims, 5 Drawing Sheets

MASK LAYOUT FOR SIDEFED RF POWER AMPLIFIER

FIELD OF THE INVENTION

The present invention relates to radio frequency amplifiers. Specifically, the physical layout of wiring interconnections used to evenly distribute the total current and power of an RF power amplifier having multiple bipolar amplifying transistors operating in a parallel circuit configuration is disclosed.

BACKGROUND OF THE INVENTION

Heterojunction bipolar transistors often provide more efficient RF power amplification than other semiconductor devices in integrated circuit form. Extremely high power efficiency can be obtained because of the high power density and high threshold, breakdown voltage of the transistors. For high power designs, a multitude of devices are used in some form of parallel structure to distribute the total power over a sufficiently large surface, such that excessive heat does not accumulate to degrade the performance or reliability of the devices.

During normal operation, the total amplifier current is equally distributed through the numerous transistors and excessive heat and other problems do not occur. However, if the parallel transistors are slightly mismatched, one transistor will operate at a higher temperature than the others and draw a larger amount of current. Since the combined current carried by the parallel devices of the power amplifier is more than enough to destroy a single transistor, the possibility exists for a transistor to experience "thermal runaway." Thermal runaway results when one device fails and the remaining operational devices must bear the amplification burden without the failed device. To maintain the amplification, the remaining operational devices each must bear a larger portion of the combined current flowing through the power amplifier. Due to the increased current each remaining transistor bears, these transistors become increasingly heated. If an transistor becomes too hot, it too will fail, thereby causing a chain reaction failure of the other transistors comprising the power amplifier.

Unfortunately, even small differences in device characteristics or physical placement can cause an imbalance of heating between the individual devices. Any bipolar device that is connected in parallel with other similar devices and that becomes hotter than its neighbors will tend to draw more current, thus heating itself more. The heating compounds itself and the result is a thermal runaway phenomenon which will destroy the device and the integrated circuit (IC) that incorporates the device.

A prior art RF power amplifier, output stage comprised of multiple heterojunction bipolar transistor elements, connected in a parallel circuit configuration, is illustrated in the schematic of FIG. 1. The multiple transistor transistors, labeled Q1A–Q1N, form the output stage of the power amplifier and can be imagined as effectively forming a more powerful unitary transistor, Q1. Prior art solutions typically employ additional circuit elements to achieve thermal stability. These additional elements are placed in series with the output device. Since these additional elements contain a current impedance component, the power efficiency of the circuit is degraded. Therefore, it is highly desirable to convert as much power as is possible from the DC power supply into RF power at the output of the circuit. U.S. Pat. No. 5,629,648 is illustrative of prior art designs used to balance the load through the individual elements of the large effective output transistor Q1. The insertion of resistors RB1–RBN into the circuit of FIG. 1, to balance the power load through the transistors Q1A–Q1N, reduces the power amplifier efficiency.

The present invention recognizes that the physical layout of the power amplifier, output stage, of FIG. 1, is an important design consideration. The parasitic inductances of the wire interconnections used to make all of the necessary connections to create the simplified schematic of FIG. 1, produce appreciable impedances at the operational RF frequencies. If ignored, these impedances can an undesirable mismatch in the instantaneous currents at the leads of transistors Q1A–Q1N and induce a thermal runaway situation.

SUMMARY OF THE INVENTION

The solution to the above-described problem is obtained by configuring the physical layout of the schematic to minimize the impedances of the conductive interconnections at the operational RF frequencies. Additionally, it is necessary to provide substantially the same transient current and voltage waveforms to the base inputs of each output transistor so that the waveform at each input is substantially in phase with the waveform at all of the other parallelly connected base inputs.

The present invention provides a side fed amplifier comprising a plurality of transistors connected in parallel such that the base, emitter, and collector leads of each transistor are electrically connected to the base, emitter, and collector leads, respectively, of all other transistors. A common, physical point interconnects the power amplifier current source and the base leads of every transistor. The transistors are spacially arranged such that the impedance between the common physical point and the base lead of any one transistor is substantially equivalent to the impedance between the common point and the base lead of any other transistor within the power amplifier.

BRIEF DESCRIPTION OF THE DRAWINGS

The above and other objects, features, and advantages of the present invention will become more apparent from the following detailed description that is to be read in conjunction with the accompanying drawings, in which.

DETAILED DESCRIPTION OF INVENTION

Figure 1:
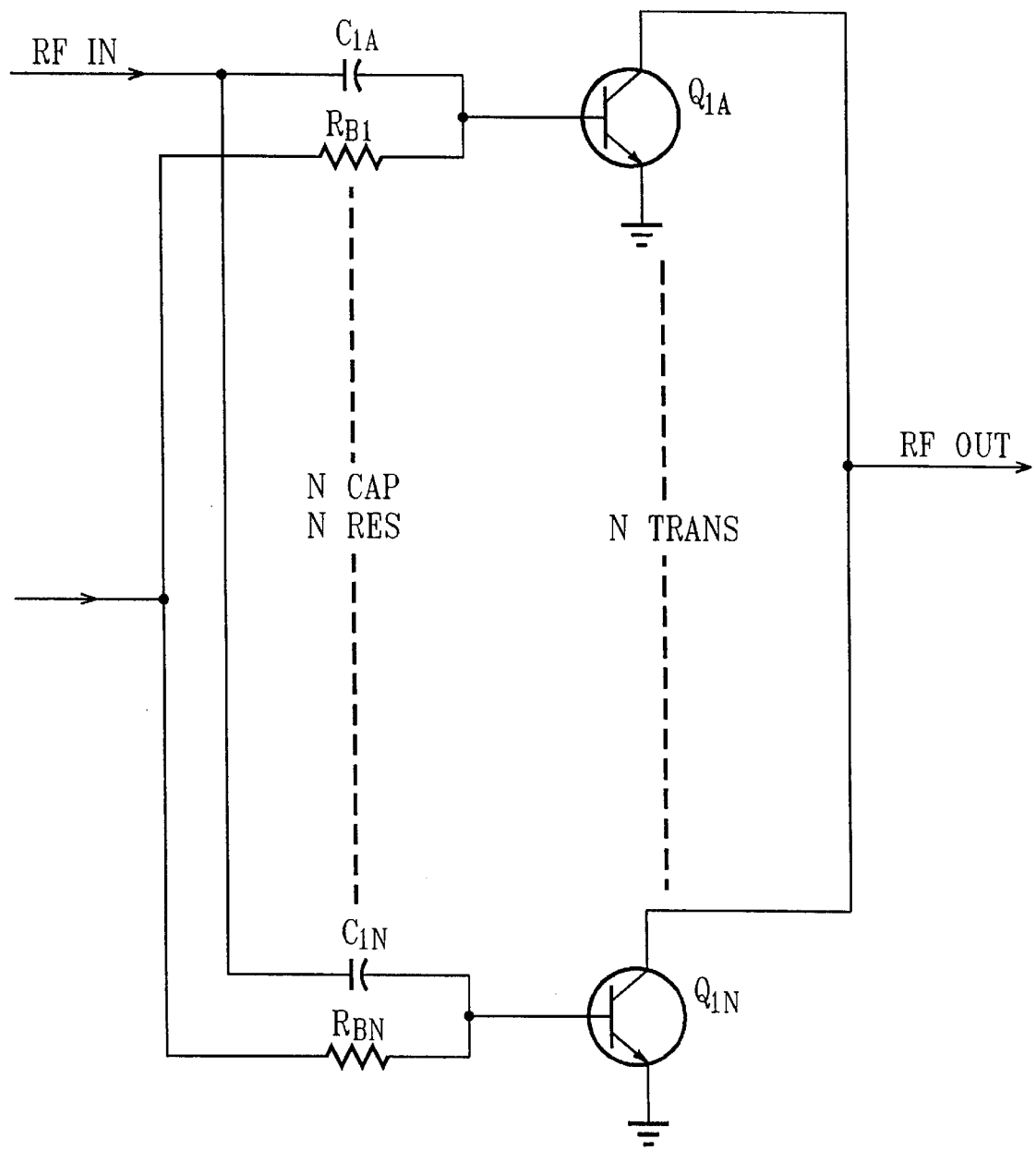
FIG. 1 illustrates a prior art power amplifier comprising a plurality of heterojunction bipolar transistors connected in a parallel circuit configuration.
Figure 2:
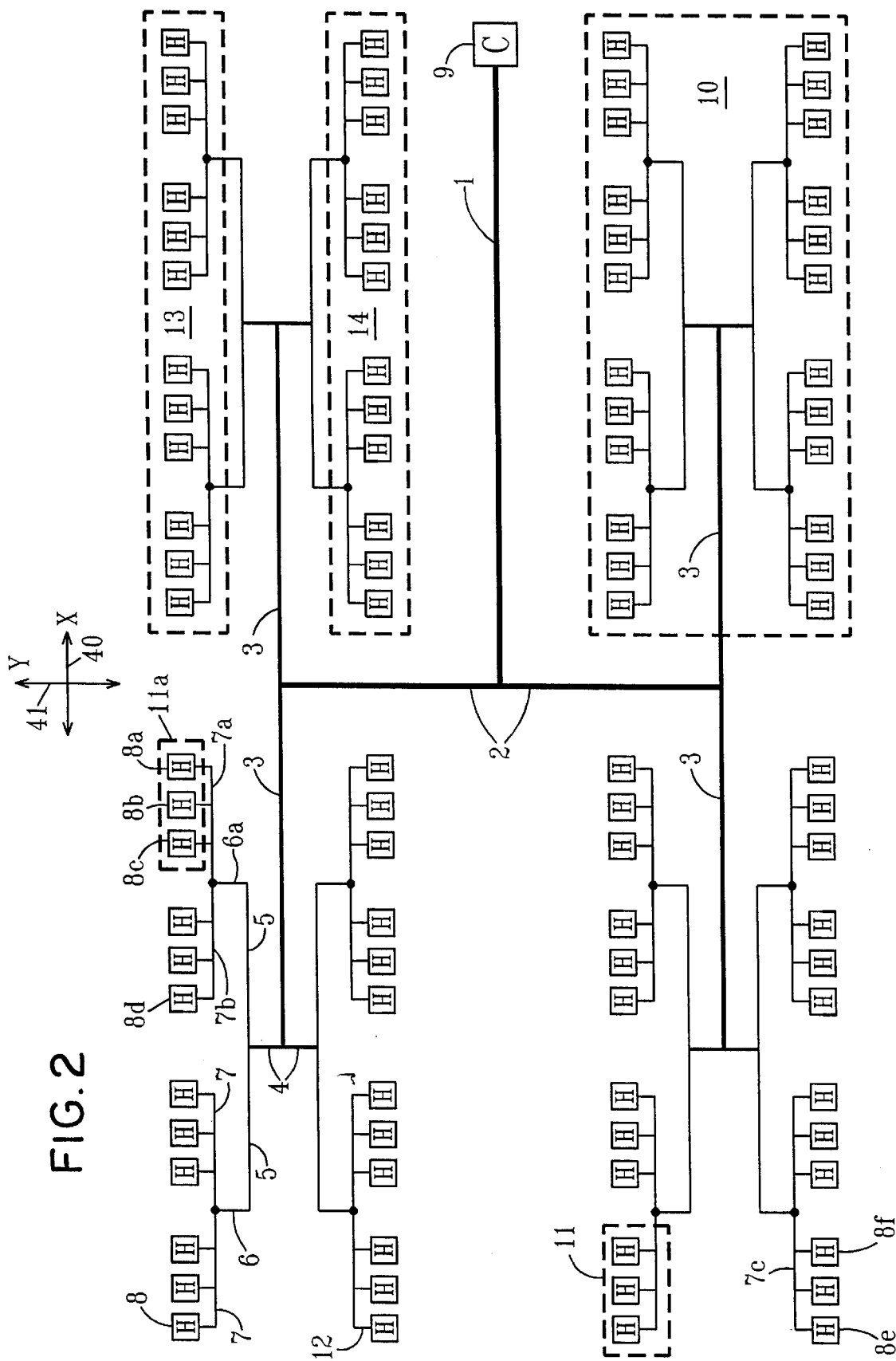
FIG. 2 illustrates the preferred embodiment of the invention for interconnecting the signal source for the power amplifier with the base leads of the heterojunction bipolar transistors comprising the power amplifier.

Referring now to FIG. 2, a preferred embodiment of the invention is shown for distributing the RF input signal to each base element. A wiring distribution layout, illustrated by FIG. 2, is provided that improves power distribution among a plurality of parallel heterojunction bipolar transistors. While the illustrative embodiment utilizes heterojunctoin transistors, it should be recognized that the inventor is not limited to the use of heterojunction transistors.

The elemental transistor devices 8 of the power amplifier are arranged in four major groups 10 as shown in FIG. 2. Each major group 10 has two rows 13, 14 of elemental transistor devices 8 parallel to a first axis 40, which the second row 14 flipped vertically from that of the first row 13, to form a mirror image of the first row. The conductive, interconnect line segments 1, 4, 5 and 6 carry the RF input signal to the base leads 12 of every elemental transistor device 8.

The first interconnect line segment 1 is parallel to axis 40 and carries all of the input current required by the multitude of electrically-parallel, elemental transistor devices 8 and, therefore, has the largest width. The second, interconnect line segment 2 is parallel to axis 41 and splits the current evenly between the two top and two bottom major groups 10, so the width of this interconnect line is reduced accordingly. Each one of the four, third interconnect line segments 3 runs parallel to axis 40 between the mirror-image rows 13 and 14 of a different major 10, creating a sideways "H" -like image in conjunction with interconnect line segment 2. The third, interconnect line segments 3 run parallel to axis 40 each have widths that are sized appropriately to carry half of the current carried by a second, interconnect line segment 2.

Each fourth, interconnect line segment 4 runs parallel to axis 41 and conveys the current from a third, interconnect line segment 3 to a mirror-image row 13 or 14 of elemental transistor devices 8 within each major group 10. Fourth, interconnect line segments 4 each carry half the amount of current that a third, interconnect line segment 3 carries and, therefore, are sized appropriately. Two, fifth interconnect line segments 5 run parallel to the axis 40 and convey the current from a fourth, interconnect line segment 4 to a row 13 or 14 of elemental transistor devices 8 within each major group 10. The fifth, interconnect line segments 5 each carry half the amount of current that a fourth, interconnect line segment 4 carries and, therefore, are sized appropriately. A sixth, interconnect line segment 6 runs parallel to axis 41 and convey the current from a fifth, interconnect line segment 5 to one-half of the elemental transistor devices 8 within each row 13 or 14 of a major group 10. The sixth, interconnect line segments 6 each carry the same amount of current that a fifth, interconnect line segment 5 carries and, therefore, are sized appropriately. Each of two seventh, interconnect line segments 7 run parallel to axis 40 and convey the current from a sixth, interconnect line segment 6 to the base lead inputs 12 of all elemental transistor devices 8 comprising one-fourth of a row 13 or 14 within each major group 10. The seventh, interconnect line segments 7 each carry half the amount of current that a sixth, interconnect line segment 6 carries and, therefore, are sized appropriately. However, the width of each seventh, interconnect line segment 7 is sufficiently large that each elemental transistor device 8 has substantially the same waveform and phase of the RF input signal applied to its base lead. An aggregation 11 of elemental transistor devices 8 comprise a set of the transistors connected by a single, seventh, interconnect line segment 7. For each elemental device 8, the RF input signal first passes through a parasitic coupling capacitor and then reaches the base of the NPN bipolar transistor.

The structure of this embodiment has several symmetrical properties. Each of the aggregations 11 is symmetrical with other aggregations 11 about two perpendicular axes, 40 and 41. Similarly, each set of two aggregations having seventh, interconnect line segments 7a and 7b connected to a single sixth, interconnect line segment 6a are symmetrical with other sets of two aggregations about axes 40 and 41. Both a row 13 or 14 and a group 10 are symmetrical about axes 40 and 41 with other rows and groups, respectively. The structure of this embodiment may be constructed on a surface having dimensions along axes 40 and 41 of 2 mm by 2mm.

The above-described layout for supplying an RF input signal to the base leads of multiple transistors, which are connected in parallel to form a power amplifier, provides numerous benefits. One benefit is that the greatest impedance from the set comprised of impedances existing between the base leads 12 of every grouping of two transistors, within an aggregation 11, is substantially equivalent to half the greatest impedance from the set comprised of impedances existing between the base leads 12 of every grouping of two transistors, where one transistor is selected from any one aggregation 11 and the other transistor is selected from any other aggregation 11 comprising the power amplifier.

An example of this feature may be better understood when explained in light of FIG. 2. Within aggregation 1 la, there are three possible, non-order dependent, groupings of two transistors. These two groupings are the transistor pairs {8a, 8b}, {8b, 8c}, {8a, 8c}. Between these three groupings, the pair {8a, 8c} will have the greatest impedance between the base leads of the transistor pair. The distance between transistors 8a and 8e is the greatest distance between any two transistors of the embodiment, along the path of conductive traces. Under ideal circumstances, the impedance between the base leads of transistors 8a and 8e will be the greatest impedance between the base leads of any two transistors of the The impedance induced between the bases of transistors 8a and 8e, by the path provided by interconnect, line segments 2–7, is substantially equal to twice the impedance between the bases of transistors 8a and 8c, induced by the conductive path provided by interconnect line segment 7a. Thus, the impedance between the bases of transistors 8a and 8e is substantially equivalent to the sum of impedances obtained from the impedance between the bases of transistors 8a and 8c and the impedance between the bases of 8e and 8f. The structural configuration of this embodiment ensures that the impedance induced by the interconnect line segments 2–6 contributes insignificantly to the total impedance induced by interconnect, line segments 2–7, between the bases of transistors 8a and 8e. Substantially all of the impedance between the bases of transistor 8a and 8e is induced by the interconnect line segments 7a and 7c.

Another benefit of the embodiment is that the impedance between a common point 9 on first, interconnect line segment 1 and the base lead 12 of any one transistor 8 is substantially equivalent to the impedance between this first common point 9 and the base lead 12 of any other transistor 8 of the power amplifier. For example, the impedance induced, by the conductive traces 1–7, between the first common point 9 and the base of transistor 8c is substantially equal to the impedance between the first common point 9 base of transistor 8e. By using the power amplifier layout described herein, it is possible to reduce the current phase mismatch between the base leads 12 of any two transistors 8 to less than 20 degrees.

Figure 3:
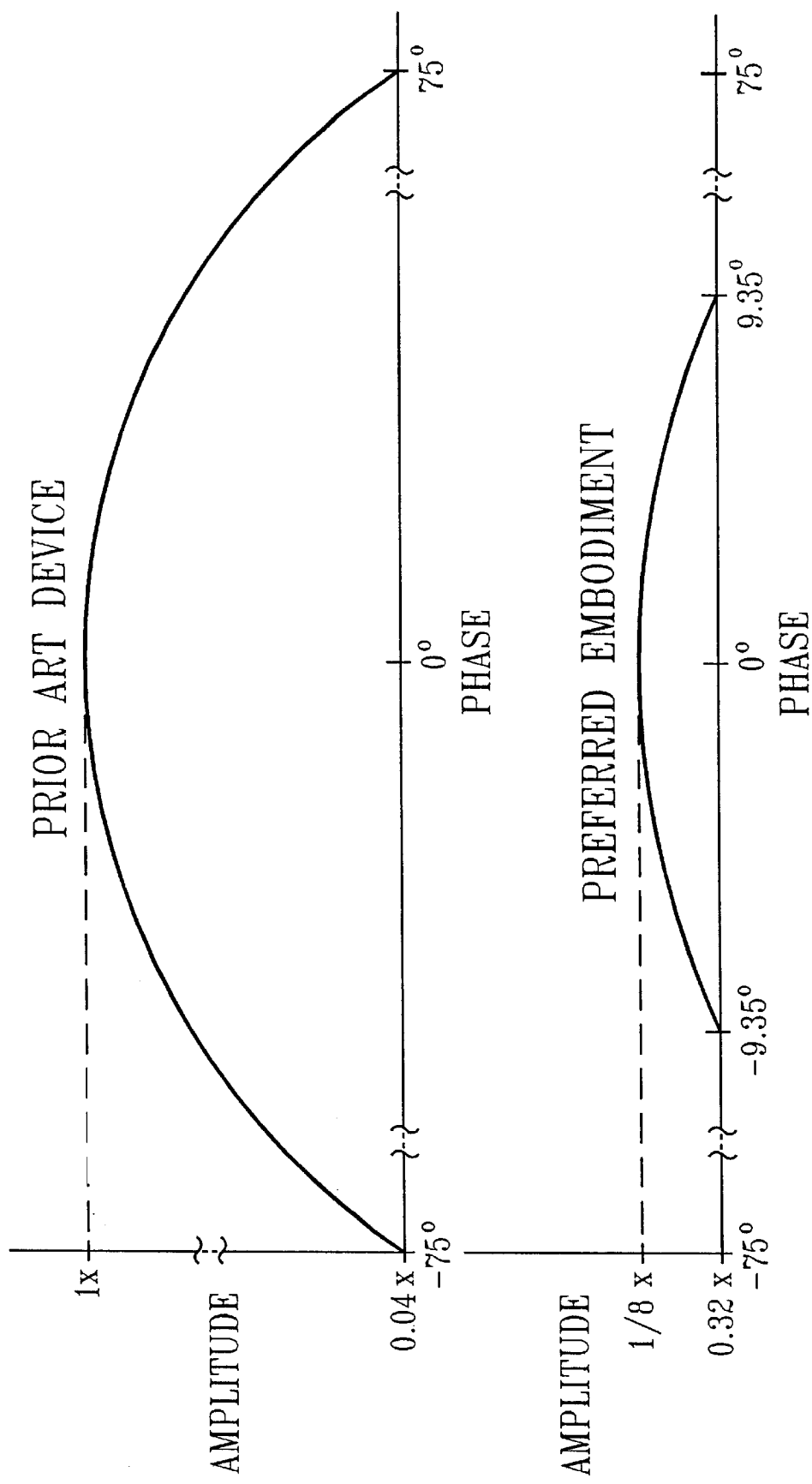
FIG. 3 illustrates the standing wave, phase and amplitude reduction on the conduction resulting from the preferred embodiment of the invention.
Figure 4:
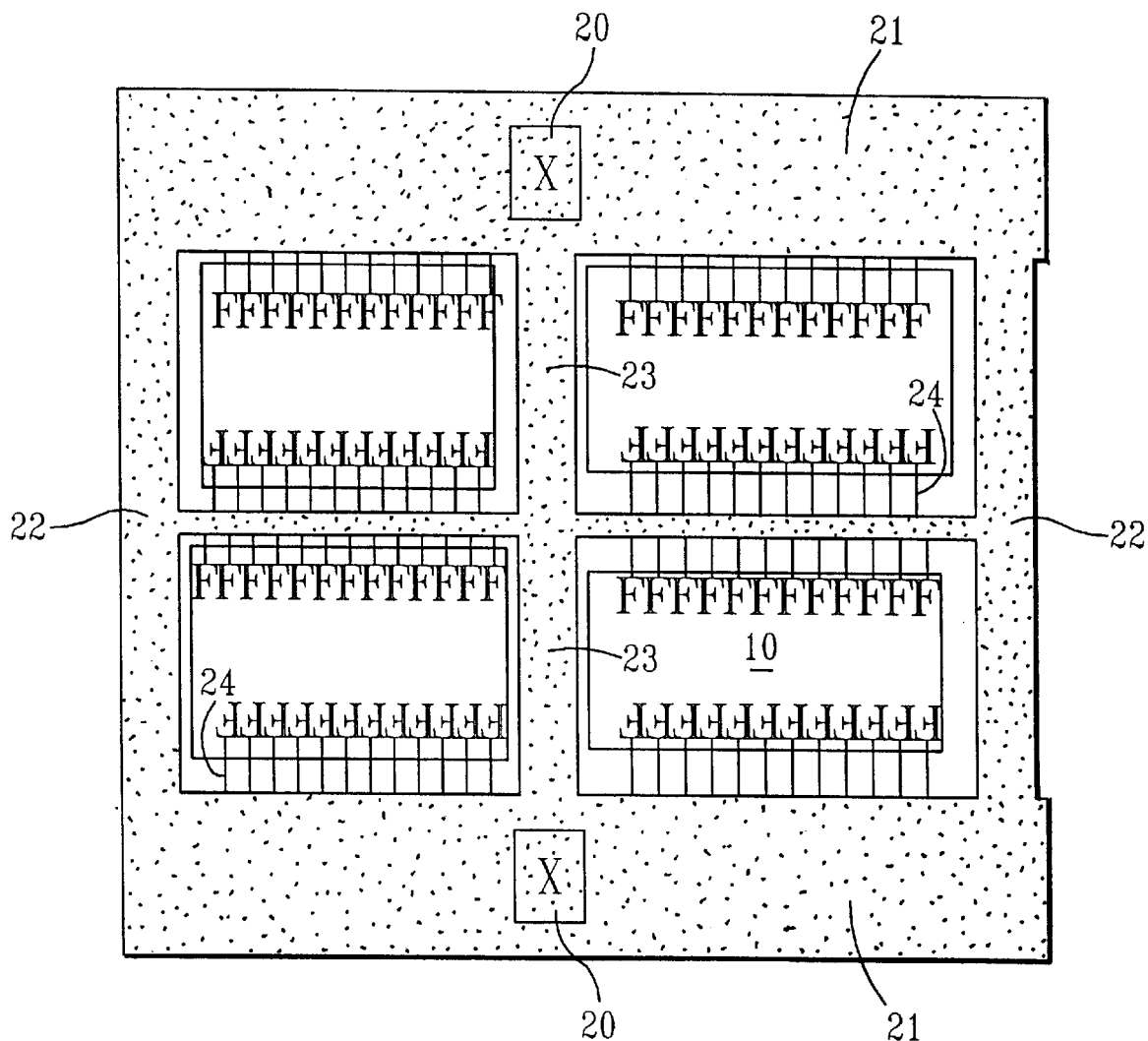
FIG. 4 illustrates the preferred embodiment for interconnecting the common ground for the power amplifier with the emitter leads of the heterojunction bipolar transistors comprising the power amplifier.

FIG. 3 illustrates the contrast between the impedance characteristics of a prior art device and the present invention. The only structural differences between the compared devices are those related to the presently defined power amplifier layout. Both power amplifier designs comprise 96 transistors connected in a parallel circuit configuration. FIG. 4 shows the standing wave signal between the base leads of the two transistors, of a power amplifier, having the largest impedance mismatch, for both a prior art design and one of the present invention. Where a prior art design might have a standing wave with a 75-degree phase difference, the present invention can reduce this phase difference to less than one-eighth as much. Similarly, the present invention can reduce the amplitude of the standing wave to less than one-eighth the amplitude of the standing wave found in the prior art device. These benefits are obtained because the structure described herein ensures that each of the elemental transistor devices 8 have substantially the same instantaneous amplitude and phase of the input waveform appearing on their base leads, for the signal waveform of operational interest.

FIG. 4 shows the emitter connections 24 of an amplifier of the preferred embodiment. The conductive interconnect lines 21–24 electrically connect all of the elemental transistor devices 8 to at least one common point 20. The common point 20 is connected to the system ground. The embodiment illustrated in FIG. 4 contains two common points 20. Interconnect line segment 21 carries more current than the other segments and is the widest so as to introduce the smallest possible impedance induced, voltage drop. The vertical interconnect line segments 22 and 23 carry less current than do the interconnect line segment 21, with the center interconnect line segments 23 tending to carry more than the outer interconnect line segments 22.

Figure 5:
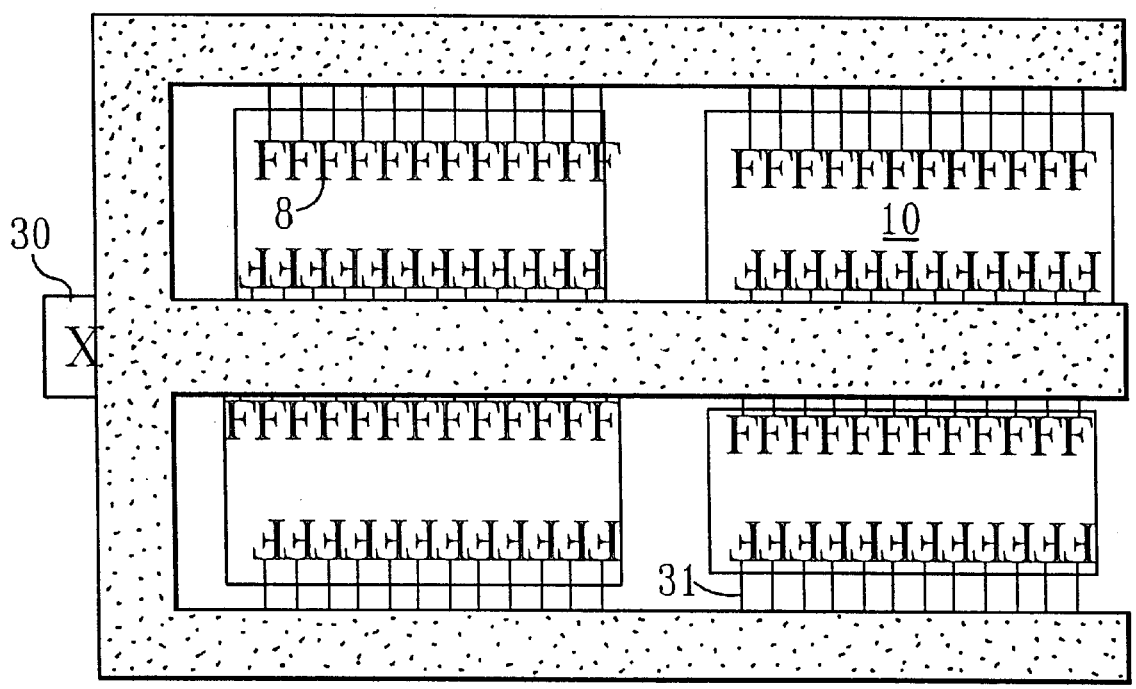
FIG. 5 illustrates the preferred embodiment for interconnecting the load for the power amplifier with the collector leads of the heterojunction bipolar transistors comprising the power amplifier.

In the preferred embodiment illustrated in FIG. 5, the elemental transistor device collectors 31 are connected to a common RF output point 30. The layout of the conductive traces may be similar to the layout used for interconnecting the emitter with a common point 20. However, it is not necessary that the same structure be used, provided that all of the elemental transistor device 8 have substantially the same instantaneous amplitude and phase of the output waveform appearing on their collector leads, for the signal waveform of operational interest.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A side fed RF amplifier comprising:
 a plurality of bipolar transistors forming an array of transistors having emitter and collector leads connected in parallel; and
 a plurality of circuit traces, symmetrical with respect to first and second axes, of said array of transistors which connect base leads of said plurality of transistors to a common circuit point which receives an input signal, said traces and transistors having a spacial relationship so that an impedance from a base lead of any of said transistors to said common point is substantially the same as the impedance from any other of said base leads to said common point.

2. The side fed RF amplifier according to claim 1, wherein:
 said transistors are arranged as aggregations of transistors, said aggregations are arranged symmetrically with respect to first and second axes and base leads of each of said aggregations are connected to a single conductive trace; each of said conductive traces is joined to other conductive traces that interconnect with the single conductive trace of other aggregations.

3. A side fed RF amplifier, comprising:
 a plurality of aggregations of elemental transistor devices, said aggregations forming groups of aggregations which are symmetrical with respect to first and second perpendicular axes, and said transistor devices having emitters and collectors which are connected to each other in parallel;
 first plurality of circuit traces which interconnect the bases of each transistor device of an aggregation;
 a second plurality of circuit traces interconnecting pairs of said first plurality of circuit traces; and
 a third plurality of circuit traces interconnecting said second plurality of circuit traces to a common point which receives an input signal and a source current, said first, second, and third plurality of circuit traces being symmetrical with respect to first and second axes, and equally spaced from each base connection so that the impedance between said common point and said transistor bases are substantially the same for all of said transistor devices.

4. The side fed RF amplifier according to claim 1, wherein:
 said transistors are arranged as aggregations, the base leads of said transistors within an aggregation are connected to a single conductive trace, and said single conductive traces are interconnected by circuit traces from said plurality of circuit traces; and
 the greatest impedance from the set comprised of impedances existing between the base leads of every grouping of two transistors, among any one of said plurality of aggregations, is substantially equivalent to half the greatest impedance from the set comprised of impedances existing between the base leads of every grouping of two transistors, among said plurality of transistors, where one transistor is selected from any one of said plurality of aggregations and the other transistor is selected from any other of said plurality of aggregations.

5. The side fed RF amplifier according to claim 4, wherein:
 the mismatch of current phase between the base leads of any two transistors, among said plurality of transistors, is less than 20 degrees.

6. The side fed RF amplifier according to claim 4, wherein:
 said plurality of transistors comprises 96 transistors.

7. The side fed RF amplifier according to claim 6, wherein:
 said side fed RF power amplifier is incorporated into an integrated circuit having any two dimensions no greater than 2 mm by 2 mm.

8. The side fed RF amplifier according to claim 4, further comprising:
an output termination for terminating the power generated by said plurality of transistors;
a second common point electrically connected to the output termination;
a second plurality of conductive traces electrically connecting every collector lead, of said plurality of transistors, to said second common point; and
said plurality of transistors selectively arranged such that the impedance between said second common point and the collector lead of any one transistor of said plurality of transistors is substantially equivalent to the impedance between said second common point and the collector lead of any other transistor of said plurality of transistors.

9. The side fed RF amplifier according to claim 4, further comprising:
a current sink termination for terminating the current passing through the emitter of every transistor of said plurality of transistors;
a third common point electrically connected to the input of said current sink termination;
a second plurality of conductive traces electrically connecting every emitter lead, of said plurality of transistors, to said third common point; and
said plurality of transistors selectively arranged such that the impedance between said third common point and the emitter lead of any one transistor of said plurality of transistors is substantially equivalent to the impedance between said third common point and the emitter lead of any other transistor of said plurality of transistors.

10. A side fed RF amplifier, comprising:
a plurality of transistors connected in parallel such that the base, emitter, and collector leads of each transistor are electrically connected to the base, emitter, and collector leads, respectively, of all other transistors of said plurality of transistors;
an even-numbered plurality of aggregations, each comprising multiple transistors, from said plurality of transistors, each plurality of aggregations comprising:
  (a) the base leads of said multiple transistors electrically connected by a single, first conductive trace from said plurality of conductive traces,
  (b) each of said first conductive traces, used to electrically connect said multiple transistors, forming a first line segment,
  (c) each of said multiple transistors substantially spaced equidistantly and aligned on a common axis running parallel to said first line segment, and
  (d) a single, second conductive trace, from said plurality of conductive traces, and having first and second ends, said second conductive trace:
    i. forming a second line segment,
    ii. electrically connected at the first end to the midpoint of said first line segment to form a normal intersection with said first line segment, and
    iii. having a cross-sectional area, transverse to its longitudinal axis, that is at least twice that for said first conductive trace;
a plurality of third conductive traces, from said plurality of conductive traces, each forming a third line segment and having a cross-sectional area, transverse to its longitudinal axis, that is substantially the same as that for said second conductive trace;
an even-numbered plurality of collections comprised of four aggregations, from said plurality of aggregations, each one of said plurality of collections comprising:
  (a) a first end of a first of said third line segments electrically connected to the second end of said second line segment from a first aggregation to form a perpendicular intersection between said third line segment and said second line segment,
  (b) a second end of said first of third line segments electrically connected to the second end of said second line segment from a second aggregation to form a perpendicular intersection between said third line segment and said second line segment,
  (c) the perpendiculars formed by both of said second line segments of said first and second aggregations with said first of third line segments directed in the same direction from said first of third line segments,
  (d) a first end of a second of said third line segments electrically connected to the second end of said second line segment from a third aggregation to form a perpendicular intersection between said third line segment and said second line segment,
  (e) a second end of said second of third line segments electrically connected to the second end of said second line segment from a fourth aggregation to form a perpendicular intersection between said third line segment and said second line segment,
  (f) the perpendiculars formed by both of said second line segments of said third and fourth aggregations with said second of third line segments directed in the same direction from said third line segment, and
a single, fourth conductive trace, from said plurality of conductive traces, and having first and second ends, said fourth conductive trace:
  i. forming a fourth line segment,
  ii. electrically connected at the first end to the midpoint of said first of third line segment to form a normal intersection with said first of third line segments, and
  iii. electrically connected at the second end to the midpoint of said second of third line segment to form a normal intersection with said second of third line segments, and
  iv. having a cross-sectional area, transverse to its longitudinal axis, that is at least twice that for said third conductive trace;
a current source for generating the current supplied to every base lead of said plurality of transistors;
a first common point electrically connected to the output of said current source; and
a conductive path, from said plurality of conductive traces, said conductive path:
  (a) electrically connecting said first common point to the midpoints of each of said fourth line segments to form perpendicular intersections between said conductive path and each of said fourth line segments, and
  (b) having a cross-sectional area, transverse to its longitudinal axis, that is greater than the sum of the cross-sectional areas of each of said fourth conductive traces combined.

11. A side fed RF amplifier according to claim 10, further comprising:
a plurality of fifth conductive traces, from said plurality of conductive traces, each forming a fifth line segment and having first and second ends, said fifth conductive traces comprising:

(a) a cross-sectional area, transverse to its longitudinal axis, that is at least twice that for one of said plurality of fourth conductive traces, (b) a first end electrically connected to the midpoint of a first of said fourth line segments to form a perpendicular intersection between said fifth line segment and said fourth line segment, and (c) a second end electrically connected to a second of said fourth line segments to form a perpendicular intersection between said fifth line segment and said fourth line segment;

at least one sixth conductive trace, from said plurality of conductive traces, each forming a sixth line segment and having first and second ends and each having a cross-sectional area, transverse to its longitudinal axis, that is at least twice that for one of said plurality of fifth conductive traces;

each of said sixth conductive traces, one for every multiple of four collections comprising said power amplifier comprising:

(a) the first end electrically connected to the midpoint of a first of said fifth line segments to form a perpendicular intersection between said fifth line segment and said sixth line segment, and;

(b) the second end electrically connected to the midpoint of a second of said fifth line segments to form a perpendicular intersection between said fifth line segment and said sixth line segment; and a conductive path, from said plurality of conductive traces:

(a) electrically connecting said first common point to the midpoints of each of said sixth line segments to form perpendicular intersections between said conductive path and each of said sixth line segments, and (b) having a cross-sectional area, transverse to its longitudinal axis, that is greater than the sum of the cross-sectional areas of each of said sixth conductive traces combined.

* * * * *